United States Patent
Lee

(10) Patent No.: US 6,614,664 B2
(45) Date of Patent: Sep. 2, 2003

(54) MEMORY MODULE HAVING SERIES-CONNECTED PRINTED CIRCUIT BOARDS

(75) Inventor: Dong Yang Lee, Seongnam (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/924,758

(22) Filed: Aug. 8, 2001

(65) Prior Publication Data

US 2002/0048157 A1 Apr. 25, 2002

(30) Foreign Application Priority Data

Oct. 24, 2000 (KR) ........................................ 2000-62542

(51) Int. Cl.[7] .............................. H05K 1/00; H05K 1/11; H01R 12/16
(52) U.S. Cl. ........................ 361/784; 361/748; 361/785; 361/790; 361/791; 361/804
(58) Field of Search ......................... 1/17, 27, 83, 121; 326/30, 83, 86, 90, 115; 333/12, 22 R, 32, 177, 181, 245; 361/770, 776, 783–784, 790, 791, 804, 748

(56) References Cited

U.S. PATENT DOCUMENTS

| | | | | |
|---|---|---|---|---|
| 3,585,399 A | * | 6/1971 | Andrews, Jr. | 362/30 |
| 5,575,686 A | * | 11/1996 | Noschese | 439/620 |
| 5,726,583 A | * | 3/1998 | Kaplinsky | 362/30 |
| 5,825,259 A | * | 10/1998 | Harpham | 333/22 R |
| 5,949,657 A | | 9/1999 | Karabatsos | 361/803 |
| 6,160,417 A | * | 12/2000 | Taguchi | 326/30 |

* cited by examiner

*Primary Examiner*—David Martin
*Assistant Examiner*—Michael L. Lindinger
(74) *Attorney, Agent, or Firm*—Mills & Onello LLP

(57) ABSTRACT

A memory module having series-connected printed circuit boards is provided. The memory module comprises a plurality of printed circuit boards, each comprising a plurality of memory chips mounted thereon, and signal lines and connection means for electrically connecting the printed circuit boards to one another. The connection means electrically series-connects the signal lines of each of the printed circuit boards. Preferably, an end termination circuit is formed on a terminal of the signal line of the farthest printed circuit board from a connector of a mother board, and the memory chip performs at a speed of approximately 150~300 MHz. The connection means is a flexible jumper assembly having a flexible film and a jumper line formed on the flexible film. Each of the printed circuit boards further comprises a jumper pad connected with the signal lines. The flexible jumper assembly interconnects the jumper pads of each of the printed circuit boards to one another. Among a plurality of the printed circuit boards, conductive leads are formed on an edge of one of the printed circuit boards. The conductive leads serve to connect the circuit boards with the connection means. The printed circuit board comprising the conductive leads is disposed on the first or the final of a plurality of the printed circuit boards. The jumper pads of each of the printed circuit boards are disposed opposite to the corresponding jumper pads of the other printed circuit boards.

5 Claims, 8 Drawing Sheets

MEMORY MODULE HAVING SERIES-CONNECTED PRINTED CIRCUIT BOARDS

BACKGROUND OF THE INVENTION

1. Field of the Invention

The present invention relates to the field of semiconductor manufacturing and, more particularly, to a memory module having series-connected printed circuit boards.

2. Description of the Related Art

In order to increase memory capacity, a memory module containing a plurality of memory chips on a single circuit board has been used. The memory module is inserted into a connector formed on a mother board. A plurality of connectors are provided on the mother board, thereby allowing expansion of memory capacity.

Since one connector receives one memory module, it is difficult to provide high-density and high-capacity packaging configurations and to provide high-speed performance due to the occurrence of branches. These problems are resolved by using a memory module comprising a plurality of printed circuit boards, each having memory chips mounted thereon. This technique has been disclosed in detail in U.S. Pat. No. 5,949,657 and is described below.

FIG. 1a is a cross-sectional view of a conventional memory module mounted on the mother board, and FIG. 1b is a perspective view of the memory module. FIG. 2 is a schematic view showing the connection of signal lines in the conventional memory module mounted on the mother board.

As shown in FIG. 1a, FIG. 1b, and FIG. 2, a memory module 100 comprises at least two printed circuit boards, i.e. a first circuit board 120a and a second circuit board 120b. Each of the first and the second printed circuit boards 120a, 120b comprises circuit wirings 121, a plurality of jumper pads 123, and conductive leads 125. A plurality of memory chips 111 are soldered to both sides of the first and the second printed circuit boards 120a, 120b and are electrically interconnected to the circuit wirings 121. The first and the second circuit board 120a, 120b are mechanically and electrically interconnected to each other via at least a flexible jumper assembly 130 connected to the jumper pads 123. The flexible jumper assembly 130 is formed in a "U" shape, and the first circuit board 120a and the second circuit board 120b are parallel-connected and are fixed to each other by a post pin 129. The jumper pad 123 of the first circuit board 120a is interconnected to the opposing jumper pad 123 of the second circuit board 120b via the flexible jumper assembly 130. The conductive leads 125 are inserted into the connector 141 of the mother board 140, thereby electrically connecting the memory module 100 to the mother board 140. In FIG. 2, reference numeral 150 is a control package, and reference numeral 153 identifies a signal line connecting individual memory modules 111 (see FIG. 1a).

In this conventional memory module, since two memory modules are inserted into one connector, the conventional memory module has the advantages of increasing memory capacity and of obtaining high mounting density.

However, in the conventional memory module, unit memory modules, i.e., the individual printed circuit boards, are electrically parallel-connected, thereby causing branches 132a and 132b in signal lines from the memory chips to the connectors. Thus, impedance mismatching increases, thereby also increasing the noise due to reflection. Therefore, it is difficult to reliably transmit data in a semiconductor memory device operated at high frequency.

In the case of using a memory module comprising memory chips having a speed of 100 MHz or more, for instance, a high-speed memory chip such as a double data rate synchronous DRAM (DDR) having a speed of up to 266 MHz, since the memory module is damaged by very small noise due to reflection at high-speed, it is difficult to transmit data reliably in the conventional memory module configuration. That is, the conventional memory module cannot be applied to high-speed chips.

SUMMARY OF THE INVENTION

Accordingly, an object of the present invention is to provide a memory module that prevents branches in the signal line of the memory and reduces reflection, thereby minimizing the occurrence of the noise due to reflection.

Another object of the present invention is to increase the memory capacity of a memory module by obtaining high mount density and high speed.

In order to achieve the foregoing and other objects, the present invention provides a memory module comprising a plurality of printed circuit boards, each comprising a plurality of memory chips mounted thereon and signal lines. Connection means electrically connects the printed circuit boards to each other. The connection means electrically series-connects the signal lines of each of the printed circuit boards.

Preferably, an end termination circuit is formed on a terminal of the signal line that is the most distant from a connector of a mother board.

Further, the memory chip preferably performs at a speed of approximately 150~300 MHz.

In one embodiment, the connection means is a flexible jumper assembly having a flexible film and a jumper line formed on the flexible film. Each of the printed circuit boards further comprises a jumper pad connected with the signal lines. The flexible jumper assembly interconnects the jumper pads of each of the printed circuit boards to each other. Among a plurality of the printed circuit boards, conductive leads are formed on an edge of one of the printed circuit boards. The conductive leads serve to connect the connection means to the circuit board.

The printed circuit board comprising the conductive leads is disposed on the first or the final of a plurality of the printed circuit boards.

The jumper pads of each of the printed circuit boards stand opposite to the corresponding jumper pads of other printed circuit board.

BRIEF DESCRIPTION OF THE DRAWINGS

These and other objects, features and advantages of the present invention will be readily understood with reference to the following detailed description thereof provided in conjunction with the accompanying drawings, wherein like reference numerals designate like structural elements.

FIG. 1b is a perspective view of the memory module of FIG. 1a.

FIG. 3b is a perspective view of the memory module of FIG. 3a.

DETAILED DESCRIPTION OF PREFERRED EMBODIMENTS

Preferred embodiments of the present invention will be described below with reference to the accompanying drawings.

Figure 1A:
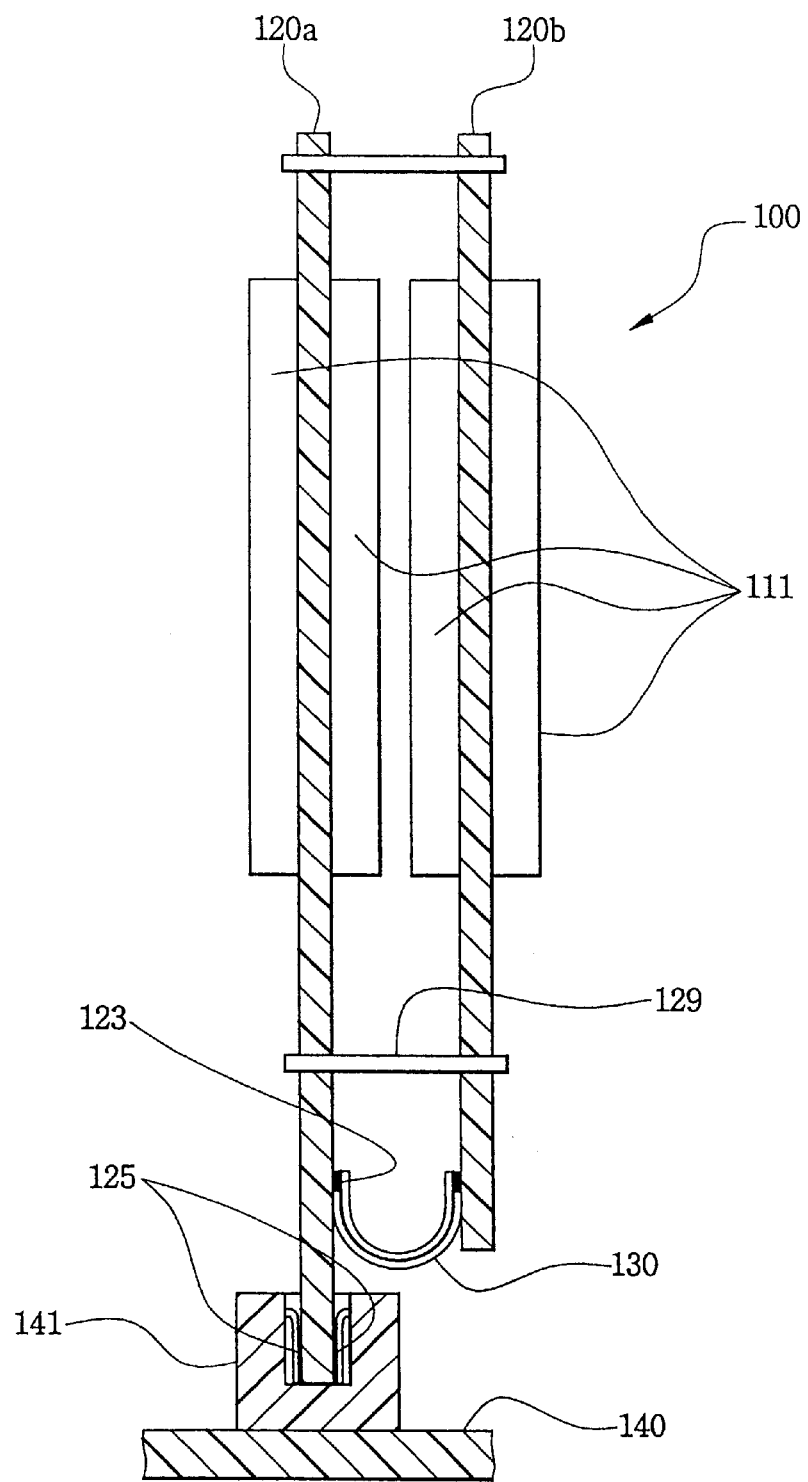
FIG. 1a is a cross-sectional view of a conventional memory module mounted on a mother board.
Figure 1B:
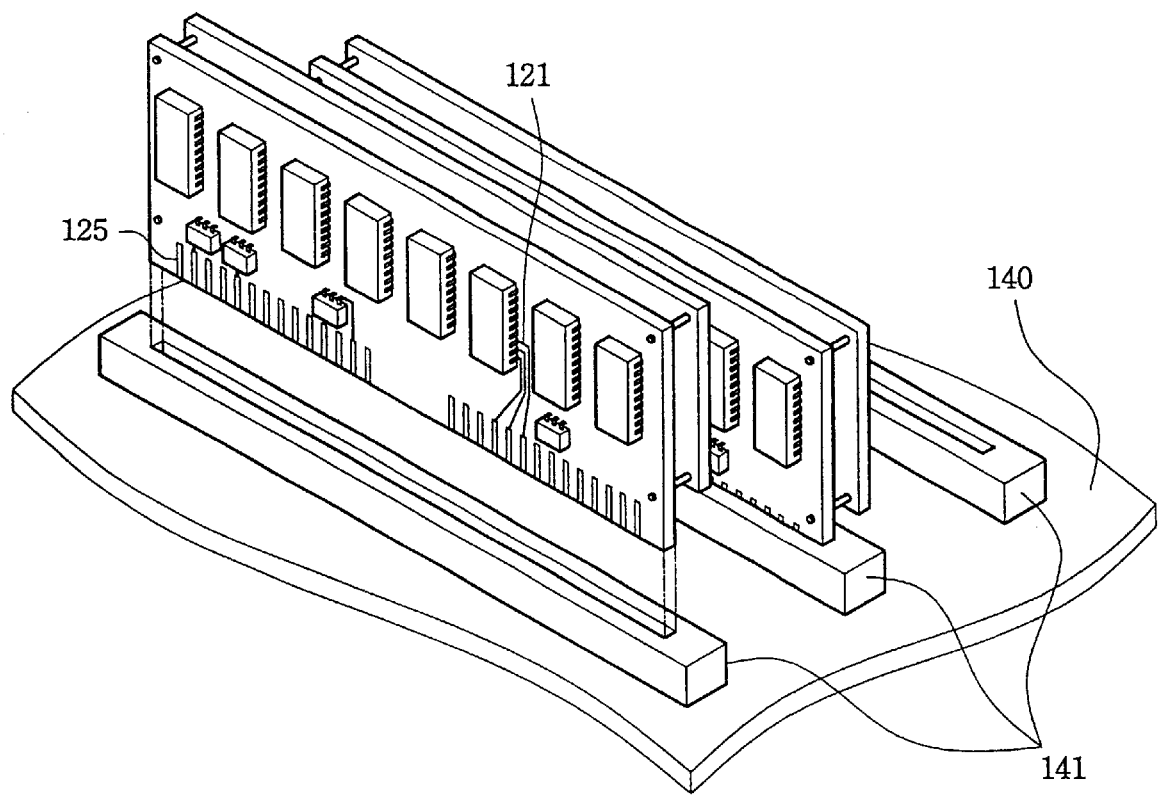
Figure 2:
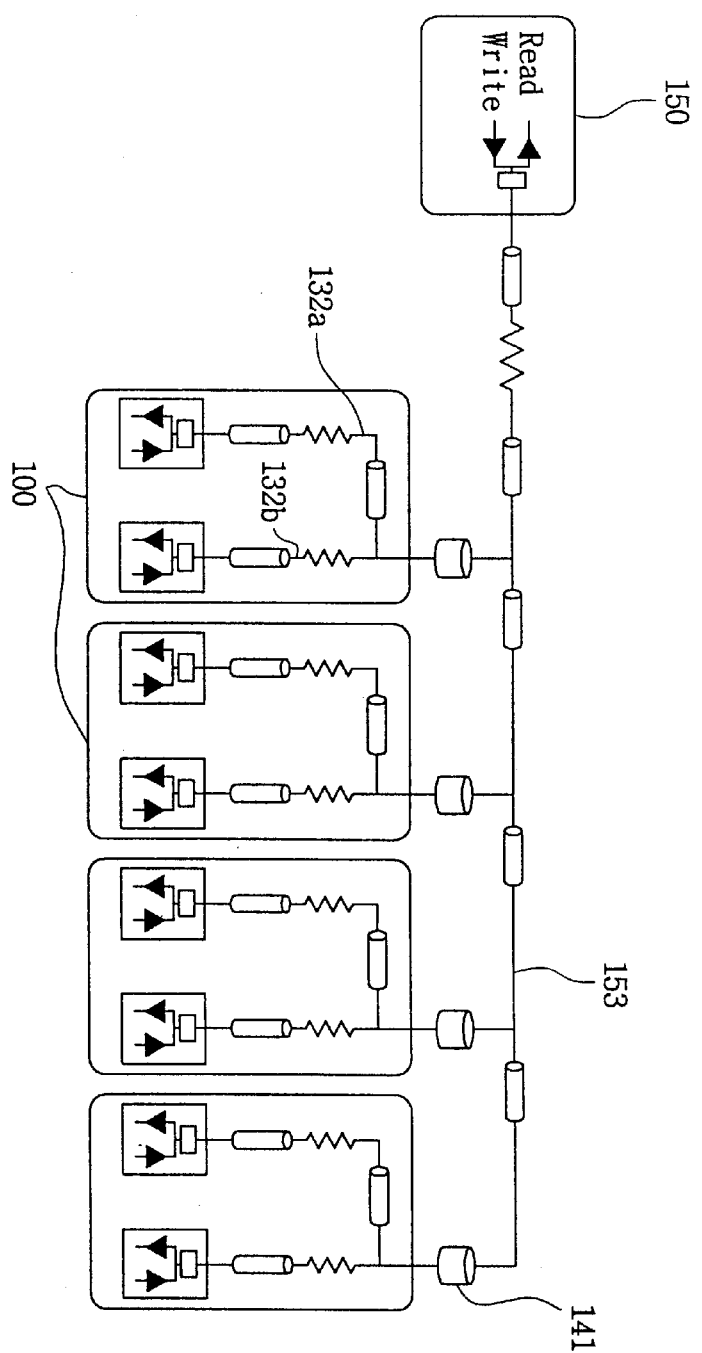
FIG. 2 is a schematic diagram showing the connection of signal lines in the conventional memory module of FIGS. 1a and 1b mounted on the mother board.
Figure 3A:
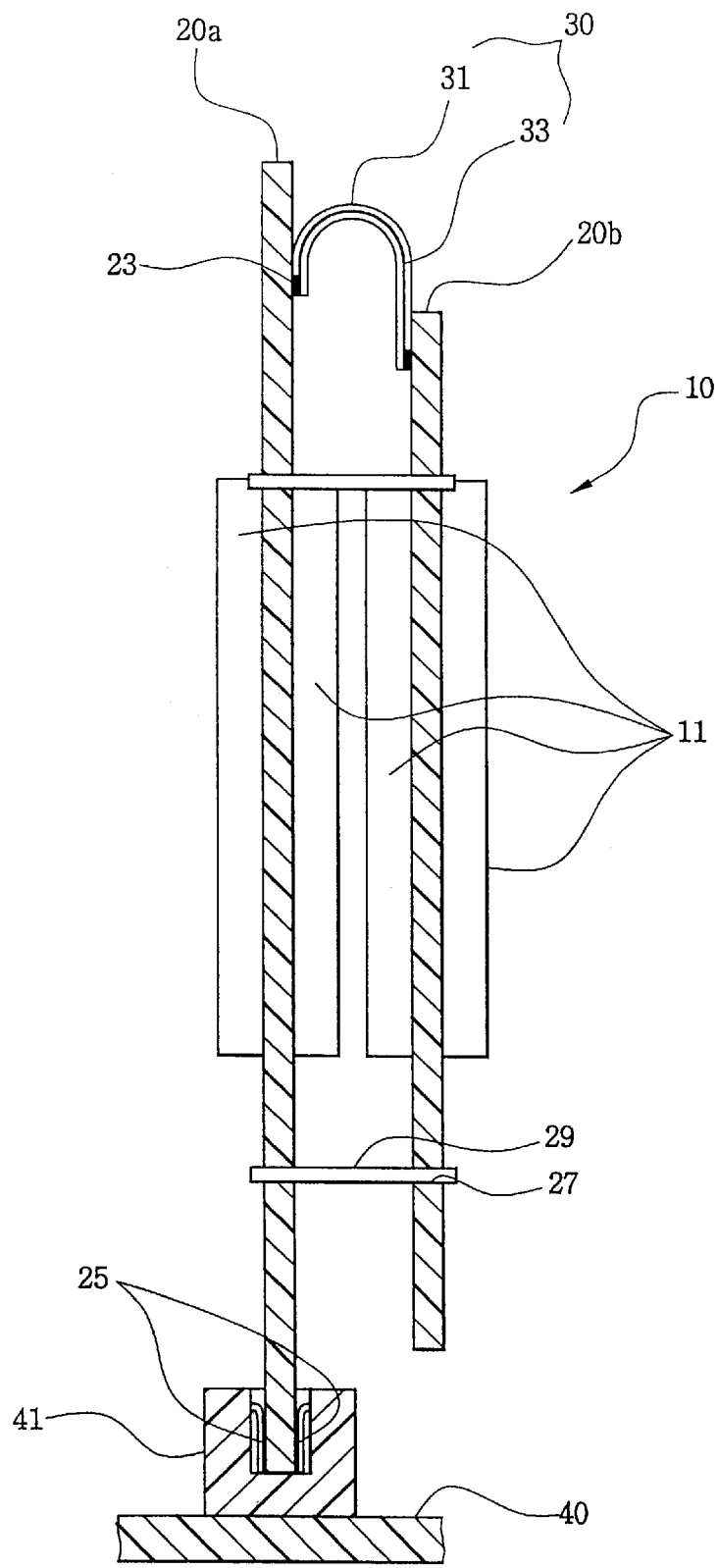
FIG. 3a is a cross-sectional view of a memory module mounted on a mother board in accordance with a first embodiment of the present invention.
Figure 3B:
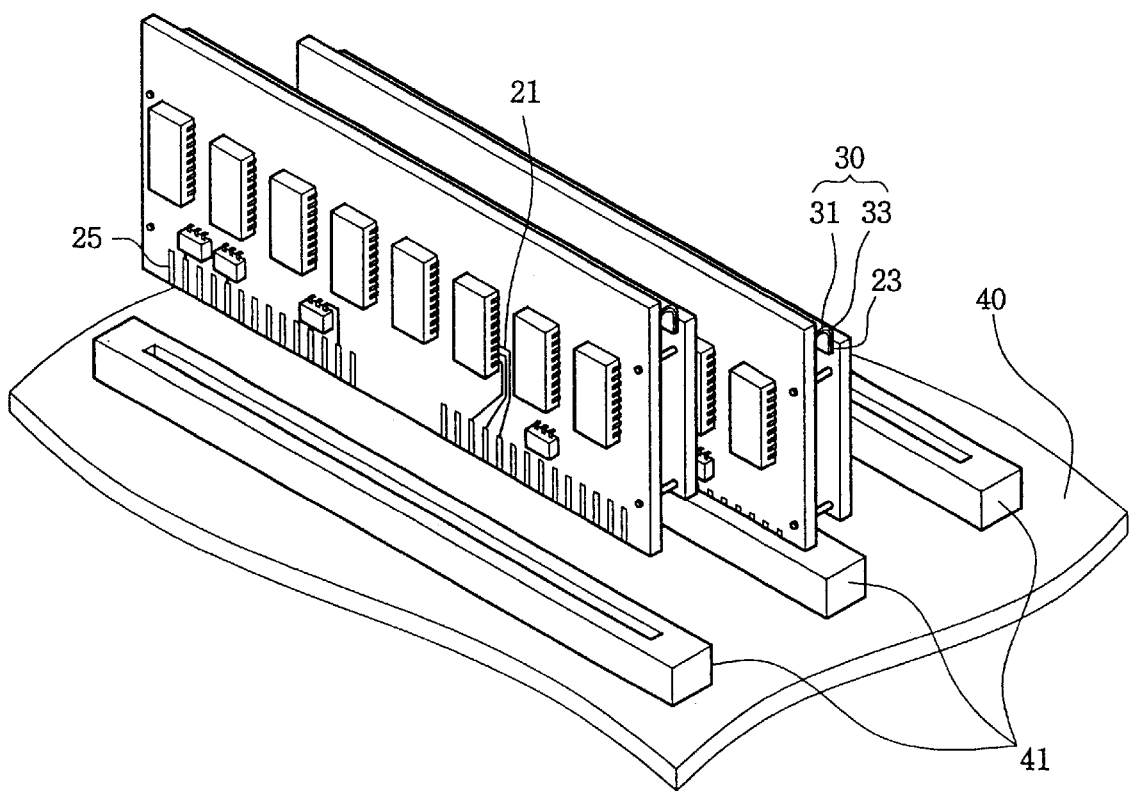
Figure 4:
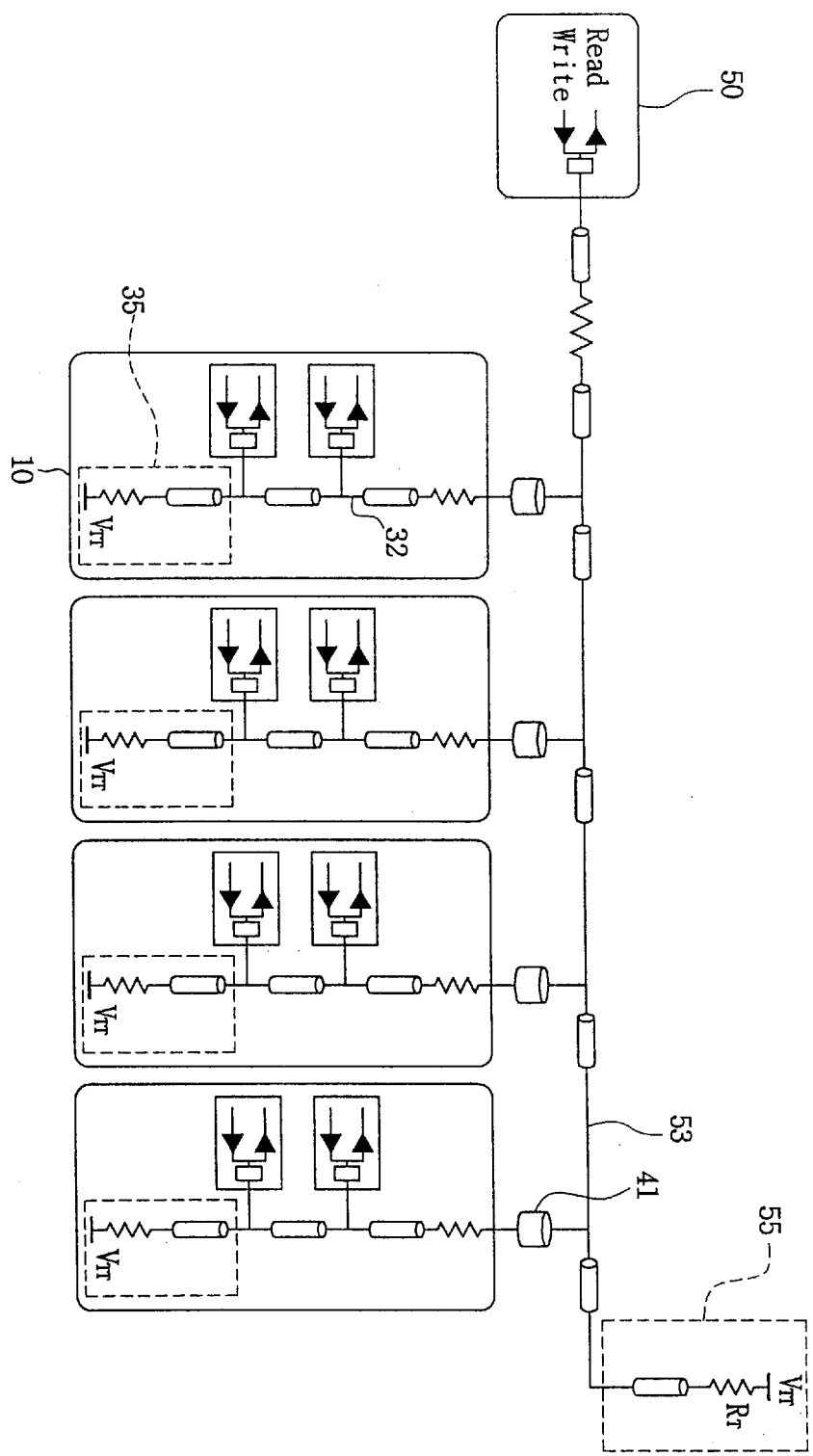
FIG. 4 is a schematic diagram showing the connection of signal lines in the memory module of the present invention.

FIG. 3a is a cross-sectional view of a memory module mounted on a mother board in accordance with a first embodiment of the present invention, and FIG. 3b is a perspective view of the memory module of FIG. 3a. FIG. 4 is a schematic diagram showing the connection of signal lines in the memory module of FIGS. 3a and 3b.

As shown in FIG. 3a, FIG. 3b, and FIG. 4, a memory module 10 comprises two printed circuit boards, i.e. a first and a second printed circuit board 20a, 20b. A plurality of memory chips 11 are mounted on both sides of the first and the second printed circuit board 20a, 20b. Circuit wirings 21 are formed on both sides of the first and the second circuit boards 20a, 20b and are electrically connected to the memory chips 11. A plurality of conductive leads 25 are formed on the edges of both sides of at least one printed circuit board and are connected to the connector 41 of a mother board 40. In this first embodiment of the present invention, the conductive leads 25 are formed on the edges of both sides of the first printed circuit board 20a. The first and the second circuit boards 20a, 20b are mechanically and electrically interconnected to each other via at least a flexible jumper assembly 30 connected to jumper pads 23. The jumper pads 23 are formed on opposing edges to the conductive leads 25. The second printed circuit board 20b does not comprise the conductive leads but comprises the jumper pads 23.

The memory chip 11 is a high-speed memory chip having a speed of 150 MHz or more. A plurality of the memory chips 11 are soldered to both sides of the first and the second printed circuit board 20a, 20b and are electrically connected to the circuit wirings 21. Herein, SDRAM, RDRAM, SRAM, DDR, or DDR2 can be used singly or in combinations as the high-speed memory chip.

The first and the second printed circuit boards 20a, 20b are connected to each other via the flexible jumper assembly 30. The flexible jumper assembly 30 comprises a flexible film 31 and a jumper line 33 formed on the flexible film 31. The jumper line 33 is made of a conductive material. Both terminals of the jumper line 33 are connected to the jumper pads 23 of the first and the second printed circuit board 20a, 20b, thereby mechanically and electrically connecting the first and the second printed circuit boards 20a, 20b to each other. The flexible jumper assembly 30 is formed in a "U" shape and the first and the second printed circuit board 20a, 20b are fixed to each other by a post pin 29 inserted into a through hole 27, thereby aligning the first and the second printed circuit board 20a, 20b in two rows. Herein, the post pin 29 is inserted into the first and the second printed circuit board 20a, 20b on an edge region where the circuit wirings 21 are not formed.

An end termination circuit 35 is formed on a terminal of a signal line of a printed circuit board that is farthest, i.e., most distant, from the connector 41 of the mother board. In this embodiment, the farthest printed board is the second printed circuit board 20b. Compared to the conventional parallel-connection, the series-connection of the printed circuit boards increases the length of the signal line 32. The increase in length of the signal line 32 may increase the noise due to reflections; therefore, the end termination circuit 35 comprises a resistance $R_T$ and a voltage $V_T$, thereby suppressing the reflection in the signal line 32 and preventing noise. If a second end termination circuit 55 is additionally formed on a terminal of a signal line 53 for connecting individual memory modules 10 of the mother board 40, noise is more effectively prevented. In FIG. 4, reference numeral 50 is a control package.

In accordance with the first preferred embodiment of the present invention, a plurality of printed circuit boards, each having a plurality of the memory chips, are series-connected. Each of the jumper pads on the upper edge of the printed circuit board is connected to the corresponding one of the jumper pads on the upper edge of the opposing printed circuit board by the flexible jumper assembly, thereby series-connecting the printed circuit boards to each other. The series-connection of the printed circuit boards prevents branching and removes impedance mismatching. Thereby, noise is effectively eliminated.

Since the memory module of the present invention comprises the end termination circuit on each of the printed circuit boards, all the signals are transmitted to load without the occurrence of reflection, thereby preventing noise due to reflection. The end termination circuit does not increase the total size of the data bus, but prevents bus stagnation. Particularly, in the case of processing a large quantity data at high speed, which is affected by fine signal distortion, the memory module of the present invention minimizes noise. This fact is known by the simulation results below.

Figure 5:
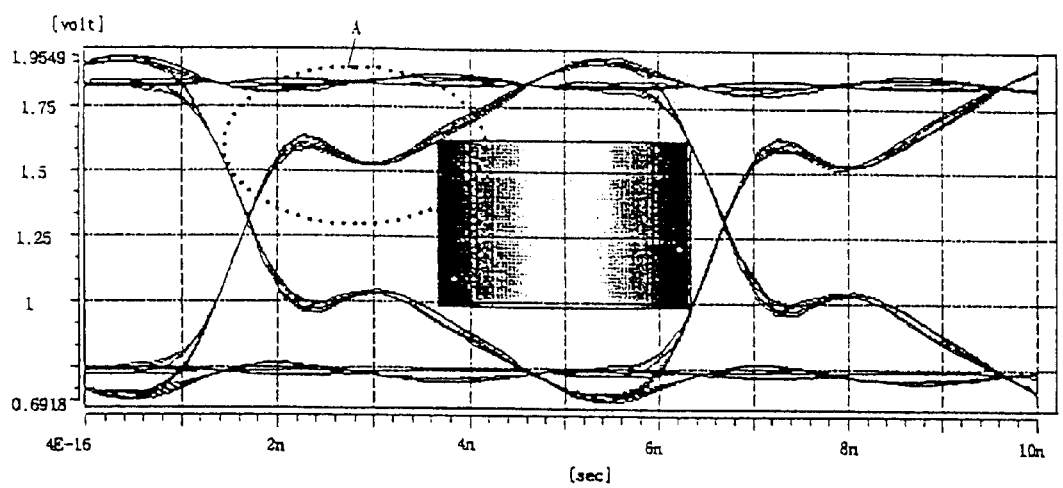
FIG. 5 is a graph showing simulation results of signal waves in the conventional memory module, on which the printed circuit boards are parallel-connected.
Figure 6:
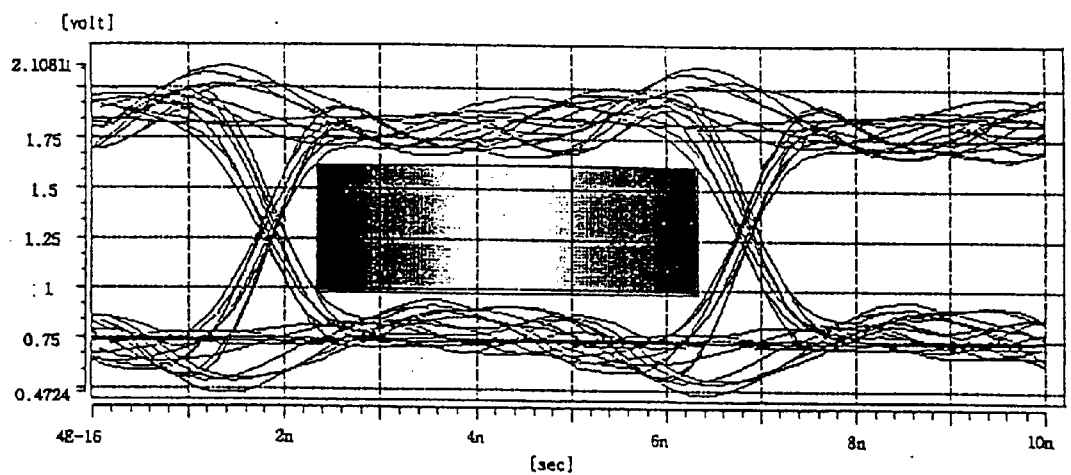
FIG. 6 is a graph showing simulation results of signal waves in the memory module of the present invention, on which the printed circuit boards are series-connected.

FIG. 5 is a graph showing simulation results of signal waves in the conventional memory module, on which the printed circuit boards are parallel-connected, and FIG. 6 is a graph showing simulation results of signal waves in the memory module of the present invention, on which the printed circuit boards are series-connected. Herein, a square represents an effective data region, and a working/performance frequency is 150 MHz.

In the conventional memory module, as shown in part "A" of FIG. 5, since the signal waves are substantially distorted by noise due the reflection, the time for transmitting the signal into the desired level, i.e. the input high level or the input low level, is delayed. Therefore, effective time in the effective data region shown by the square is reduced, and it is therefore difficult to increase the speed. However, in the present invention, as shown in FIG. 6, the distortion of the signal waves due to reflection is prevented, thereby expanding the effective data region. That is, the present invention increases the effective time and meets the demand of processing speed increase. Preferably, the working frequency of the memory module of the present invention is about 150~300 MHz.

Figure 7:
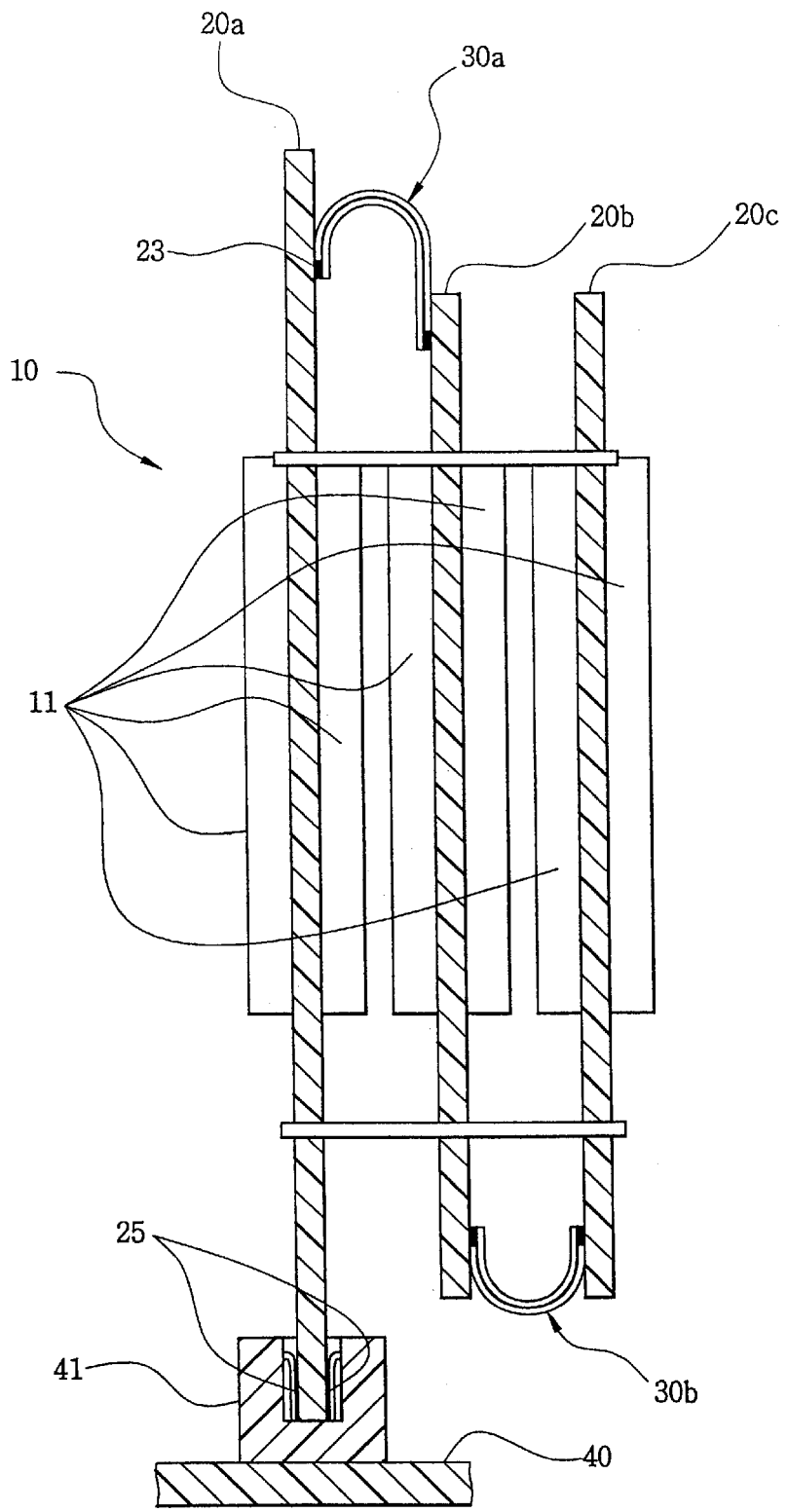
FIG. 7 is a cross-sectional view of a memory module mounted on the mother board in accordance with a second embodiment of the present invention.

FIG. 7 is a cross-sectional view of a memory module mounted on a mother board in accordance with a second embodiment of the present invention. As shown in FIG. 7, a memory module 10 comprises three printed circuit boards, i.e. first, second, and third printed circuit boards 20a, 20b, 20c. A plurality of conductive leads 25 are formed on one edge of both sides of the first printed circuit board 20a and are connected to a connector 41 of a mother board 40. The first, the second, and the third circuit boards 20a, 20b, 20c are each mechanically and electrically series-connected to one another via flexible jumper assemblies 30a, 30b connected to jumper pads 23.

In the memory module of the present invention, since a plurality of the printed circuit boards are series-connected without branching, noise due to reflection is reduced, and signal distortion is also prevented. Accordingly, the present invention can meet the demands of capacity increase and high processing speed. Further, since the memory module of the present invention comprises the end termination circuit on a terminal of the signal line of each printed circuit board, the present invention minimizes noise from reflection.

Although the preferred embodiments of the present invention have been described in detail hereinabove, it should be understood that many variations and/or modifications of the basic inventive concepts herein taught which may appear to those skilled in the art will still fall within the spirit and scope of the present invention as defined in the appended claims.

What is claimed is:

1. A memory module comprising:
   a plurality of printed circuit boards, each of the circuit boards including:
      a plurality of memory devices mounted thereon,
      a plurality of conductive leads connecting the printed circuit board to a connector of a mother board,
      a circuit wiring connecting the memory devices to the conductive leads,
      a plurality of jumper pads for the printed circuit boards being connected to each other, and
      a plurality of end termination circuits, each of the end termination circuits being connected electrically to the memory devices for preventing reflection signals from the memory device; and
   a plurality of conductive elements, each of the conductive elements connecting the jumper pad of one of the printed circuit boards to the jumper pad of another of the printed circuit boards in series along a signal line.

2. The memory module of claim 1, wherein the end termination circuit is formed on at least one terminal of at least one of said signal lines of the one of the plurality of printed circuit boards that is most distant from a connector of a mother board.

3. The memory module of claim 1, wherein said memory circuits perform at a speed of approximately 150~300 MHz.

4. The memory module of claim 1, wherein said jumper pads of each of said printed circuit boards stand opposite to the corresponding jumper pads of other printed circuit boards.

5. The memory module of claim 1, wherein the conductive element is a flexible jumper assembly having a flexible film and jumper line formed on the flexible film.

* * * * *